United States Patent [19]

Mueller et al.

[11] Patent Number: 5,607,776
[45] Date of Patent: Mar. 4, 1997

[54] ARTICLE FORMED BY IN-SITU CLEANING A TI TARGET IN A TI+TIN COATING PROCESS

[75] Inventors: Mark A. Mueller, San Jose; Xin Guo, Mountain View; John C. Egermeier, Santa Clara, all of Calif.

[73] Assignee: Applied Materials, Inc., Santa Clara, Calif.

[21] Appl. No.: 403,169

[22] Filed: Mar. 13, 1995

Related U.S. Application Data

[62] Division of Ser. No. 119,769, Sep. 9, 1993, Pat. No. 5,427,666.

[51] Int. Cl.$^6$ .................................................. B32B 15/04
[52] U.S. Cl. ........................ 428/472; 428/216; 428/336; 428/689; 428/698; 428/699
[58] Field of Search ................................. 428/469, 472, 428/688, 689, 698, 704, 216, 334, 336; 204/192.17, 192.27; 437/190, 192, 197

[56] References Cited

U.S. PATENT DOCUMENTS

| | | | |
|---|---|---|---|
| 4,783,248 | 11/1988 | Kohlhase et al. | 204/192.17 |
| 4,900,630 | 2/1990 | Suzuki et al. | 428/432 |
| 5,240,880 | 8/1993 | Hindman et al. | 437/190 |
| 5,289,035 | 2/1994 | Bost et al. | 257/750 |

*Primary Examiner*—Ellis Robinson
*Assistant Examiner*—Leonidas J. Jones, III
*Attorney, Agent, or Firm*—John P. Taylor

[57] ABSTRACT

A novel method of in-situ cleaning a Ti target in a Ti+TiN anti-reflective coating process when such Ti and TiN deposition process are conducted in the same process chamber by the addition of a simple process step and without the use of a shutter.

10 Claims, 6 Drawing Sheets

STEP 1

STEP 2

STEP 1

STEP 2

5,607,776

ARTICLE FORMED BY IN-SITU CLEANING A TI TARGET IN A TI+TIN COATING PROCESS

CROSS-REFERENCE TO RELATED APPLICATION

This application is a division of U.S. patent application Ser. No. 08/119,769, filed Sep. 9, 1993, now U.S. Pat. No. 5,427,666.

The present invention generally relates to a novel method of in-situ cleaning a Ti target used in a Ti+TiN coating process conducted in a single process chamber, more particularly, it relates to a novel method of in-situ cleaning a Ti target in a Ti+TiN anti-reflective coating process when such Ti and TiN deposition process are conducted in the same process chamber by the addition of a simple process step and without the use of a shutter.

BACKGROUND OF THE INVENTION

Physical vapor deposition (PVD) is a frequently used processing technique in the manufacture of semiconductor wafers that involves the deposition of a metallic layer on the surface of a silicon wafer. It is also known as sputtering. In recently developed advanced semiconductor devices, PVD is frequently used to deposit metallic layers of Ti for contacts and metallic layers of Al for interconnects. PVD can also be used to deposit TiN as a barrier layer on silicon wafers.

in a PVD process, inert gas particles are first ionized in an electric field to produce a gas plasma. The ionized particles are then directed toward a source or target where the energy of these gas particles physically dislodges, or sputters off, atoms of the metallic source material. PVD is a versatile technique in that many materials can be deposited using not only RF but also DC power sources.

In a typical PVD process chamber, major components include a stainless steel chamber that is certified vacuum-tight with a helium leak detector, a pumping capacity that is capable of reducing the chamber pressure to about $10^{-6}$ Torr or below, pressure gauges, a sputter source or target, a power supply, and a wafer holder. The sputter source and the wafer holder are normally positioned facing each other. The target is, for example, an Al or Ti disc used as the sputter source for the process. The target has different sizes, for instance, a 13-inch (330 mm) target is normally used for processing 8-inch (200 mm) wafers. The target is bonded to a backing plate and has a life expectancy depending on the power consumption of the process and the target material used.

In recent years, more stringent requirements of film quality and increasing wafer sizes have driven the manufacturing technology away from very large batch systems toward single-wafer processing systems. Many integrated process systems that combine several process technologies in a single machine are becoming available in the market place. In such integrated process systems, a wafer can be transported from one single-wafer process chamber or module to another through a central transfer chamber without breaking vacuum. Consequently, many of the modern processing equipment are being designed for single-wafer use in multichamber clustered integrated processing systems.

In a typical multichamber clustered integrated processing system for PVD, thin or thick metal or barrier metal films can be deposited on silicon wafers of various sizes. For instance, four PVD process chambers can be connected to a transfer chamber which is then connected to other chambers such as a pre-clean chamber, a cool down chamber, a buffer chamber for a wafer handling, and a load-lock.

Anti-reflective coatings are frequently used in semiconductor processing to reduce light reflectance on the surface of metallic layers. For instance, they are frequently used on Al metallization layers which are deposited on wafers for interconnects. Aluminum is a widely used metalization layer material in semiconductor processing due to its low melting point, high conductivity and low cost. However, one drawback of Al is that the surface of Al is highly reflective. This high surface reflectivity greatly hampers the imaging process necessary for lithography. During a lithographic process, a photoresist layer must be deposited on the Al surface based on a photographical pattern previously formed in a photo-imaging mask. The high reflectivity from the surface of Al renders this photographic transfer process extremely difficult.

To reduce the high reflectivity of Al, an anti-reflective coating layer of TiN can be deposited on the surface of Al. The TiN layer appears as a brown or golden tint which significantly reduces the reflectivity of Al from near 100% to approximately 20% at the wavelengths of visible light. This anti-reflective coating deposition process is a very important step in semiconductor processes whenever a highly reflective metal layer is used.

For a deposition process of an anti-reflective coating (or ARC) on a silicon wafer, a typical stack arrangement on the silicon surface includes a Ti contact layer, a TiN barrier layer, an Al interconnect layer, and a TiN layer for the purpose of reducing optical reflection. A four PVD chamber cluster system can be ideally utilized in this deposition process by installing Ti targets in three chambers and Al target in one chamber. The Ti contact layer is deposited by maintaining a partial pressure of Ar gas in the chamber, while the TiN layers are deposited by maintaining a partial pressure of Ar and $N_2$ gases in the process chamber. The Ar supports a plasma used in plasma sputtering while the $N_2$ reacts with the sputtered Ti to form TiN.

In many industrial applications, there may not be four process chambers available for a TiN anti-reflective coating process. For instance, it may be desirable for economic reasons to perform an ARC process in only two process chambers. In such a case, a Ti target is used in one chamber and an Al target is used in the other chamber.

When only two PVD process chambers are used to fabricate a typical four-layer stack having a TiN anti-reflective coating, a silicon wafer is first coated in the Ti chamber with a Ti layer by flowing Ar gas in the chamber. The wafer while staying in the same chamber is then coated with a layer of TiN by flowing both Ar and $N_2$ in the chamber. The silicon wafer is then transferred to the Al process chamber for the addition of the Al interconnect layer. After the Al deposition process, the wafer is transferred back to the Ti process chamber for the TiN anti-reflective coating process. This last step of TiN coating leaves a thin layer of TiN on the surface of the Ti target. Thereafter, the Al interconnect and Ti contact layers are photolithographically patterned into the desired contacts and interconnects.

When processing a second silicon wafer in the same process chamber, during the first deposition step where a pure Ti layer is supposed to be deposited on the silicon wafer, a thin layer of TiN is instead first deposited on the silicon surface resulting from the contaminated surface of the Ti target. This unwanted TiN layer at the interface of Ti and the underlying silicon greatly increases the contact resistance between them and reduces the efficiency of the Ti contact layer.

The problem of TiN contamination of a Ti target in a two-chamber system can be explained in more detail as follows. Referring initially to FIG. 1A, cross-sectional views of a Ti target 10 and a silicon wafer 20 are shown. The wafer 20 may have been previously partially processed into an integrated circuit. To process the first wafer 20, a layer 12 of Ti (i.e. a contact layer) is first deposited by flowing inert Ar gas through the process chamber. This is shown as step 1. Target 10 has a clean Ti surface after this first deposition step.

In the second deposition step for wafer 20, as shown in FIG. 1B, Ar and $N_2$ are flowed through the process chamber forming layer 14 of TiN on top of the Ti layer 12. It is noted that after this deposition step, a thin layer 16 of TiN is left on the target surface 30. This TiN layer 16 contaminates the Ti target 10. The thickness of layer 16 can be of any thickness up to 20 nm.

In the processing of the second wafer 40, as shown in FIG. 2A, in the first step of deposition when Ar gas is flowed through the process chamber, the contaminant TiN layer 16 shown in FIG. 1B on target surface 30 is first deposited on wafer 40 as TiN layer 24. It should be emphasized that the TiN material in layer 16 shown in FIG. 1B on the target 10 is now deposited on the second wafer 40 as layer 24. After the brief deposition of TiN layer 24, an intended Ti layer 26 is then deposited on top of the TiN layer 24. In the second deposition step, shown in FIG. 2B, a layer of TiN is deposited on second wafer 40 by flowing Ar and $N_2$ through the chamber to form the new TiN layer 28 on top of Ti layer 26. At the same time, another contaminant layer 32 of TiN is formed on the top surface 30 of the Ti target 10. The thickness of layer 32 can be of any thickness up to 20 nm. This starts another cycle of contamination for the next wafer to be processed in the same process chamber which also results in the undesired structure of FIG. 2B.

Others have proposed a solution to this problem of TiN contamination at the interface by placing a shutter at a position near the wafer. The unwanted TiN is then deposited on the shutter prior to the deposition of Ti on the silicon wafer. While this technique works in some application, many processing chambers do not allow the positioning of such a shutter near the wafer due to hardware configurations.

It is therefore an object of the present invention to provide a method of in-situ cleaning a Ti target without the necessity of using a shutter.

It is another object of the present invention to provide a method of in-situ cleaning a Ti target used in a TiN coating process without any modification to the processing chamber and equipment.

It is yet another object of the present invention to provide a method of in-situ cleaning a Ti target in a TiN anti-reflective coating process that can be performed in a simple processing step.

It is a further object of the present invention to provide a method of in-situ cleaning a Ti target in a TiN anti-reflective coating process by the addition of a thin Ti layer on top of the TiN layer while maintaining the desirable anti-reflective characteristic of the TiN layer.

SUMMARY OF THE INVENTION

In accordance with the present invention, a novel method of in-situ cleaning a TiN layer from a Ti target used in a TiN coating process by the addition of a simple processing step is provided.

In the preferred embodiment, the novel in-situ cleaning method is carried out by first depositing in sequence a Ti layer, a TiN layer, an Al layer, and a TiN layer for the anti-reflective coating. The process chamber is then purged with Ar gas and a thin layer of Ti which contains a small amount of TiN contaminant is deposited on top of the TiN anti-reflective coating layer. By depositing this additional layer of Ti, the surface of the Ti target is cleaned of the TiN coating from the previous TiN deposition process. By carefully controlling the film thickness of this additional Ti layer on top of the anti-reflective coating, the efficiency of the TiN anti-reflective coating is not affected. A wide process window is available for carrying out this additional cleaning step of Ti deposition.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENTS

The present invention includes a novel method of in-situ cleaning a Ti target in a TiN anti-reflective coating process without using a shutter or making any modifications to the process chamber.

Figure 1A:
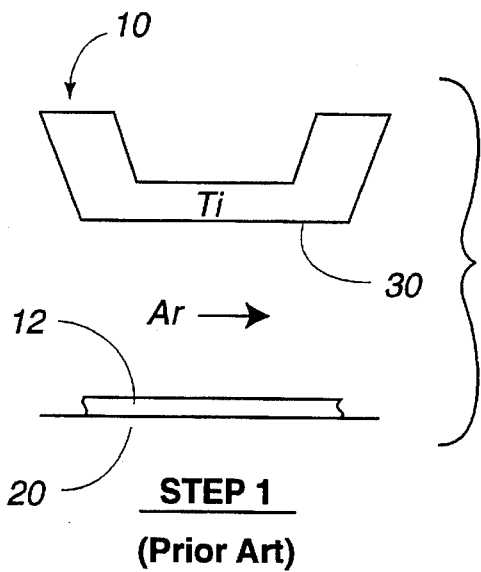
FIGS. 1A, 1B, 2A and 2B are illustrations showing cross-sectional views of a target and a silicon wafer before and after a TiN deposition process.
Figure 1B:
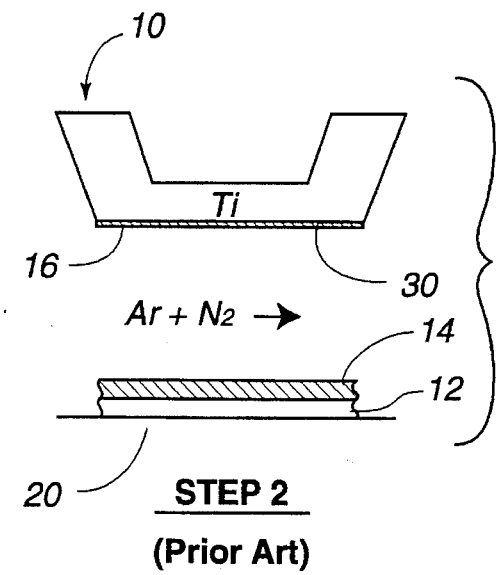
Figure 2A:
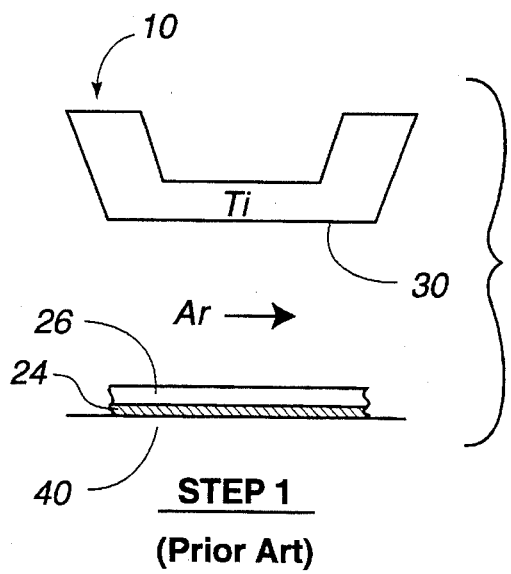
Figure 2B:
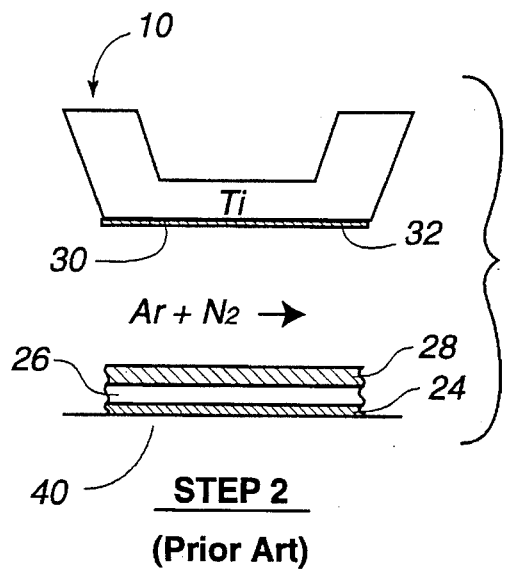
Figure 3A:
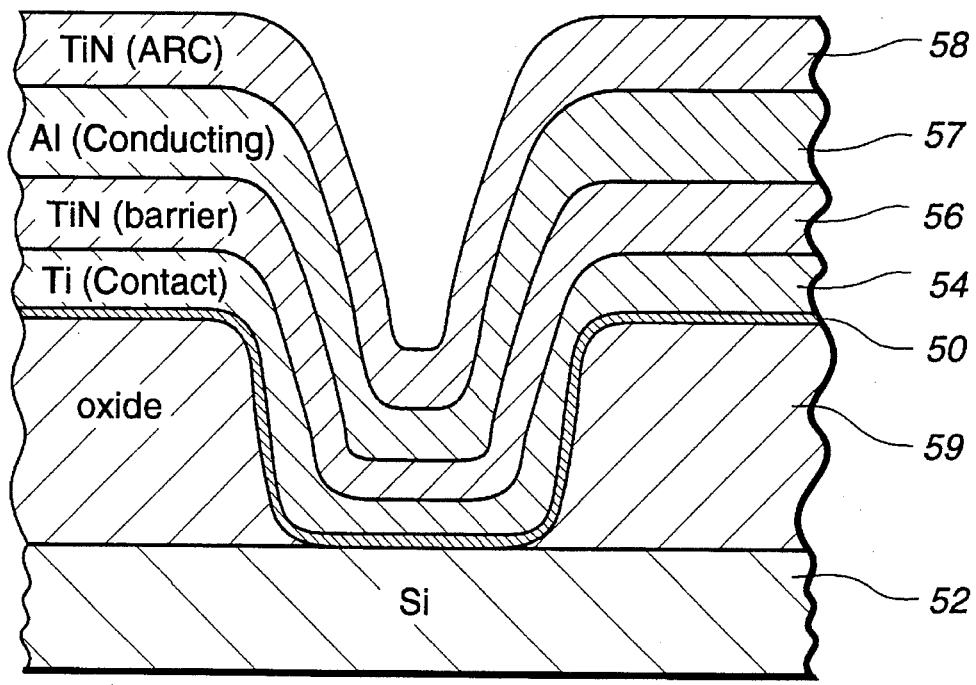
FIGS. 3A and 3B are enlarged cross-sectional views of a typical four-layer stack on a silicon wafer showing the Ti, TiN, Al and TiN deposition layers for an Al interconnect and a TiN anti-reflective coating.

Referring initially to FIG. 3A, the contamination by an unwanted TiN layer 50 on a semiconductor silicon wafer 52 is shown. A four-layer stack includes a Ti layer 54, a TiN layer 56, an Al layer 57, and a TiN layer 58 with Ti layer deposited directly on the silicon wafer 52 and a patterned oxide layer 59. In the prior art construction, a contaminant layer 50 of TiN is deposited between the silicon and the Ti contact layer. This contamination layer 50 of TiN greatly increases the contact resistance between Ti and Si and greatly reduces the contact efficiency of the Ti layer. This frequently results in defective wafers and low yield in production.

Figure 3B:
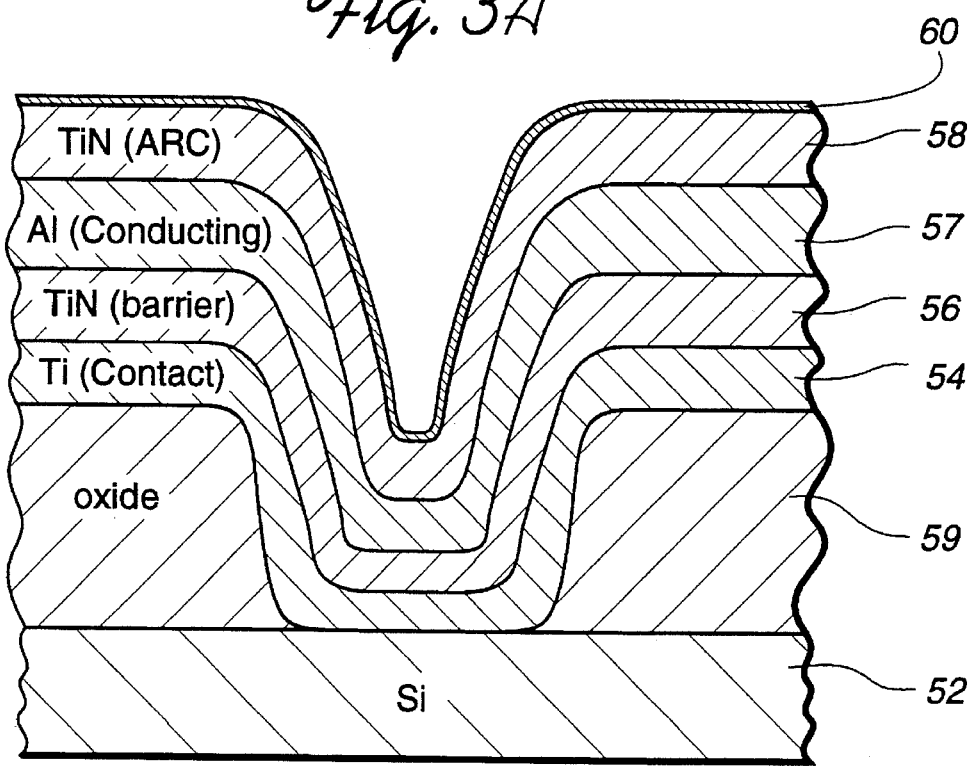

The present invention solves the TiN contamination problem by utilizing a unique and novel processing step. As shown in FIG. 3B, after a layer of TiN anti-reflective coating 58 is deposited on the silicon wafer, an additional thin Ti layer 60 is deposited on top of the anti-reflective coating layer 58. This cleaning step for the Ti target is necessary only when Ti and TiN are deposited on the surface of a silicon wafer in the same process chamber.

In such a deposition process where both Ti and TiN are deposited on a silicon wafer in the same process chamber utilizing one Ti target, after the anti-reflective coating of TiN is deposited, a thin layer of Ti is deposited on top of the TiN layer. This additional Ti deposition constitutes the final step for the TiN ARC deposition process. It removes the contaminant TiN layer on the target surface and presents a clean target ready to be used in processing the next wafer.

During this cleaning step of Ti deposition, only inactive gas such as Ar is flowed through the process chamber. The Ti layer 60 deposited on the silicon wafer over the TiN contains a small amount of impurity of TiN which is removed from the target surface.

It should be noted that the novel method of in-situ cleaning a Ti target dictates that only a final thin film 60 of Ti, i.e. between 1 nm to 20 nm thick, be deposited on a silicon wafer. If too thick a Ti film is deposited on the TiN ARC layer, the effectiveness of the ARC layer can be reduced. Too thick a layer of Ti on the TiN ARC layer will change the appearance of the wafer to that of a Ti layer and thus have high reflectivity. On the other hand, if not enough Ti is deposited on the ARC layer, there will be enough TiN contaminant left on the Ti target which will contaminate the next wafer processed in the chamber. The key, therefore, is to have just enough Ti deposited on top of the ARC layer with its anti-reflective characteristic substantially retained while consuming all the TiN contaminant on the target surface. By substantially retained, it is meant that the reflectivity of the TiN surface is kept below 40%.

It has been discovered that within a suitable energy level of between about 4.0 to about 12.0 kW-sec for a 13-inch (33 cm) target, the Ti target surface can be adequately cleaned. This relates to an energy density of 4.7 to 14.0 J/cm$^2$. This can be achieved by running the deposition at a high power for a short period of time or by running the deposition at a low power for a long period of time. For instance, the Ti layer may be deposited at a power level of 1 kW for 12 seconds such that a Ti layer of suitable thickness is deposited on the ARC layer. The Ti can also be deposited at a higher power level of 6 kW for 2 seconds to produce a Ti layer that has a similar thickness. Any suitable combination of power and time can be used so long as the energy consumed is within the range of 4.7 J/cm$^2$ to 14 J/cm$^2$.

Figure 4:
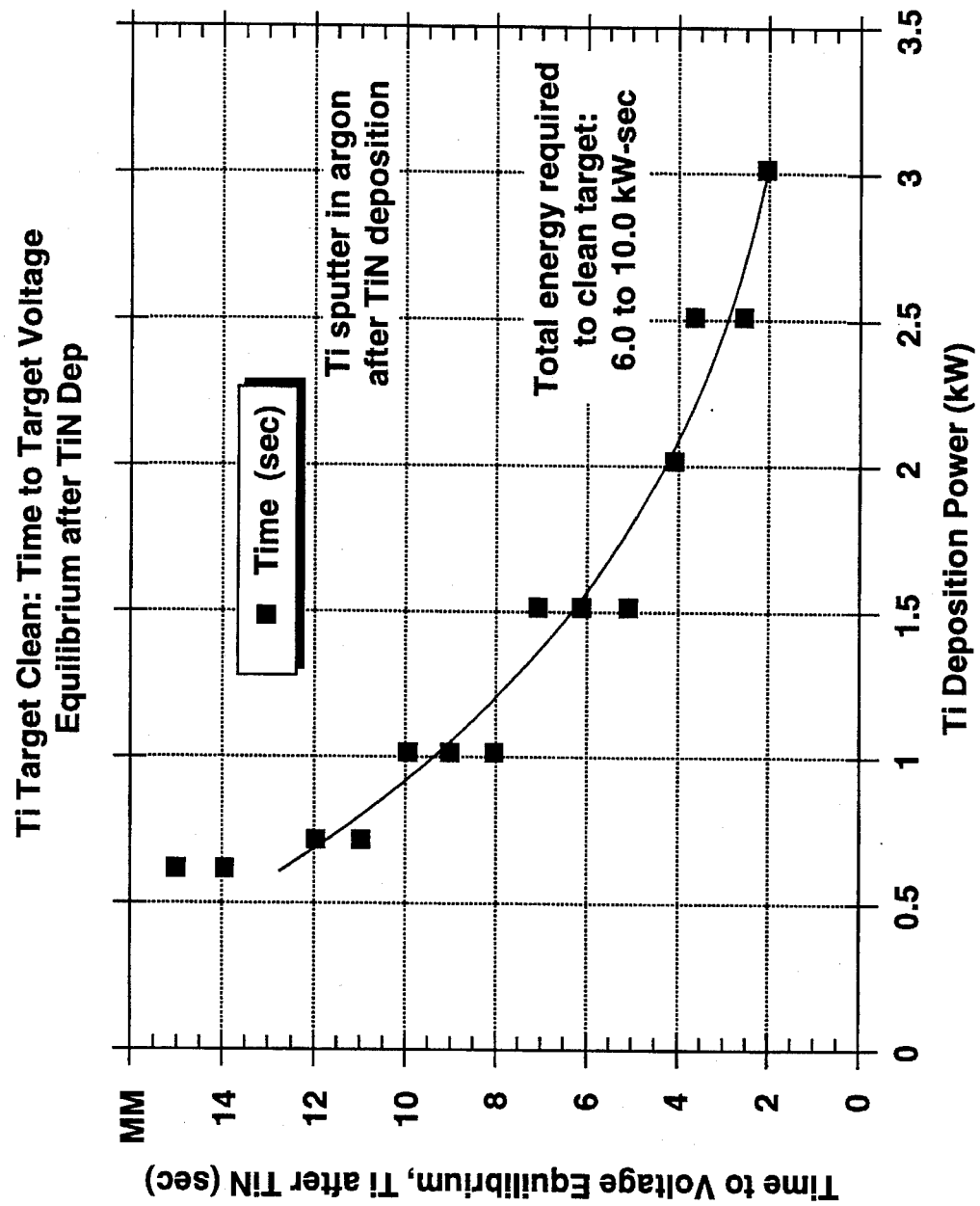
FIG. 4 is a graph showing the dependency of the time to voltage equilibrium on the Ti deposition power.

This workable range of energy level was obtained from a series of tests conducted on silicon wafers. The results of such tests are shown in FIGS. 4 through 7. FIG. 4 shows the relationship between the deposition time and the deposition power for Ti. It indicates that at higher deposition power levels, shorter time is required to achieve a clean target. At lower deposition power levels, longer time is required to effectively clean the target.

Figure 5:
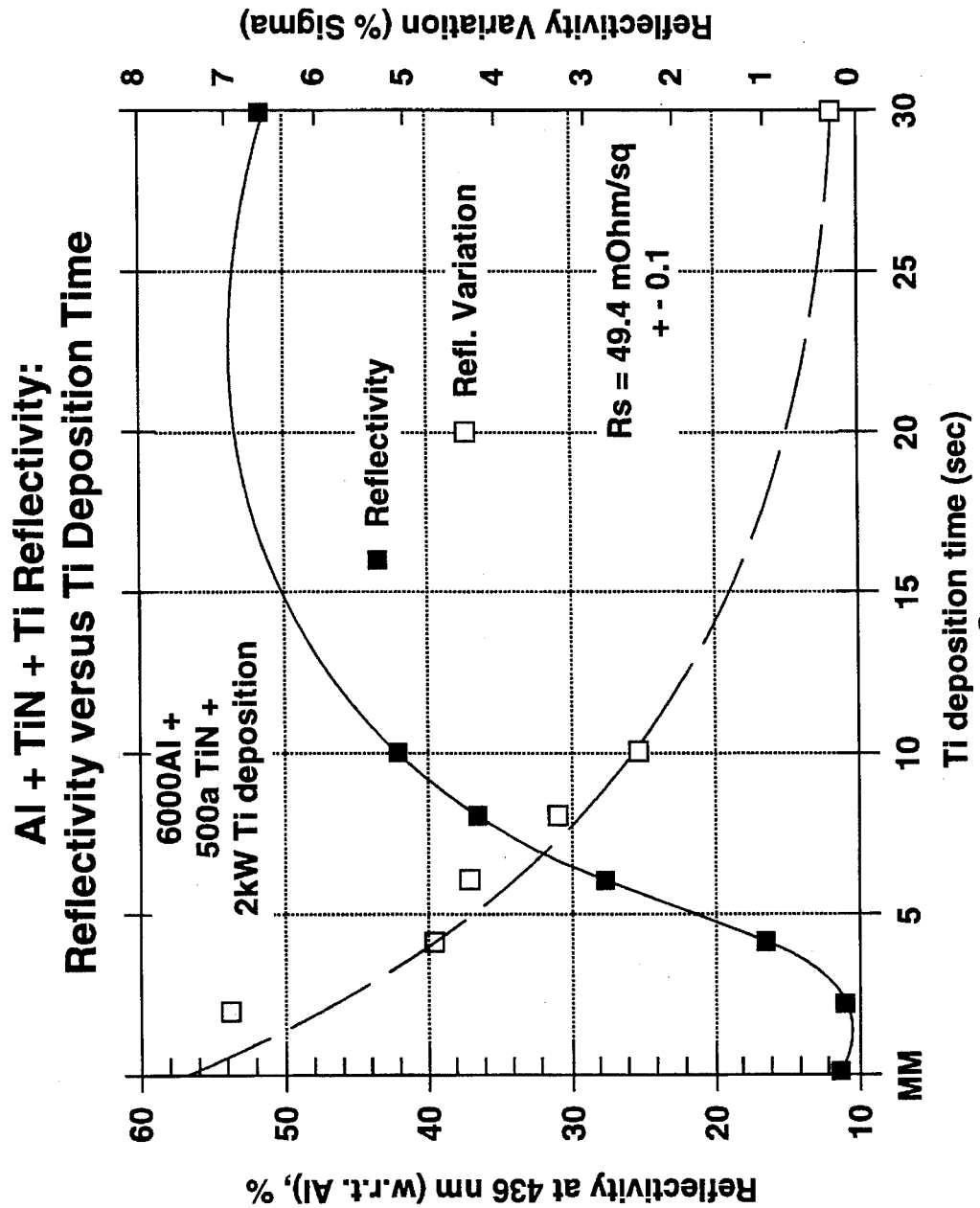
FIG. 5 is a graph showing the dependency of the reflectivity and the reflectivity variation on the Ti deposition time.

FIG. 5 shows reflectivity data on a four-layer stack construction of Ti, TiN, Al and TiN on a silicon wafer with a cleaning Ti layer deposited on top. The reflectivity and the reflectivity variation data are plotted against the Ti deposition time. It is seen that at approximately 5 seconds (at a power level of 2 kW) the reflectivity obtained is 22%. This shows an acceptable level of reflectivity and proves that the effectiveness of the TiN anti-reflective coating is not affected by the Ti cleaning layer. At a longer deposition time of 10 seconds, the reflectivity value on the Ti surface reaches 42% which is not acceptable. The silicon wafer tested has a 600 nm Al layer and a 50 nm TiN layer deposited thereon.

Figure 6:
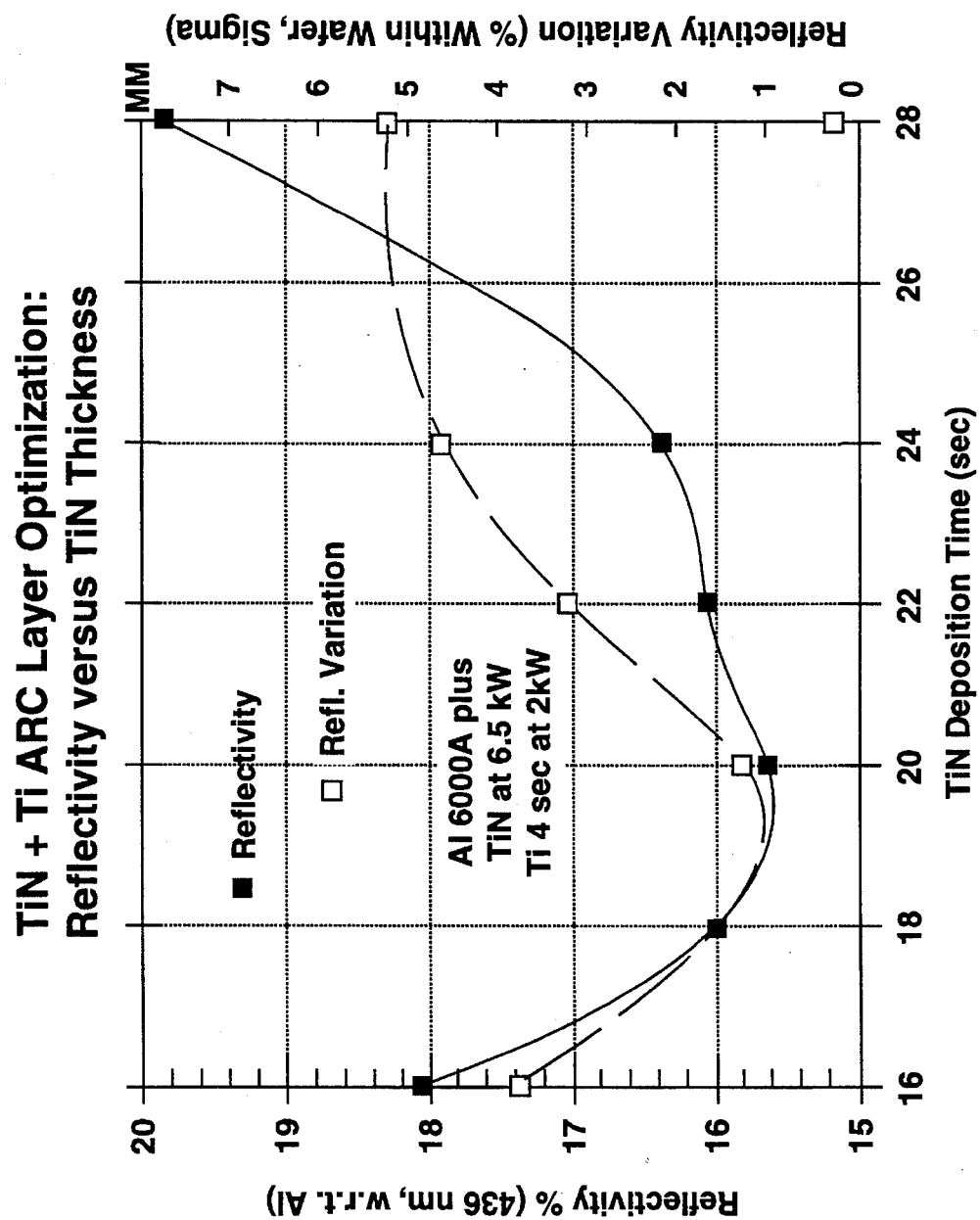
FIG. 6 is a graph showing the dependency of the reflectivity and the reflectivity variation on the TiN deposition time.

FIG. 6 is a graph showing a TiN and TiARC optimization process wherein the reflectivity is plotted against the TiN deposition time. The wafers have an Al layer of 600 nm, a TiN layer deposited at 6.5 kW of 50 nm, and a Ti cleaning layer deposited at 2 kW for 4 sec. It is seen that the reflectivity data remains within the acceptable range when the TiN deposition time is in the range between 16 sec and 28 sec. It should be noted that all samples have the same Ti cleaning layer thickness of up to 20 nm on top of the TiN ARC layer. The thickness of the Ti cleaning layer is preferably kept at about 10 nm, even though a workable range is between 1 nm to 20 nm.

Figure 7:
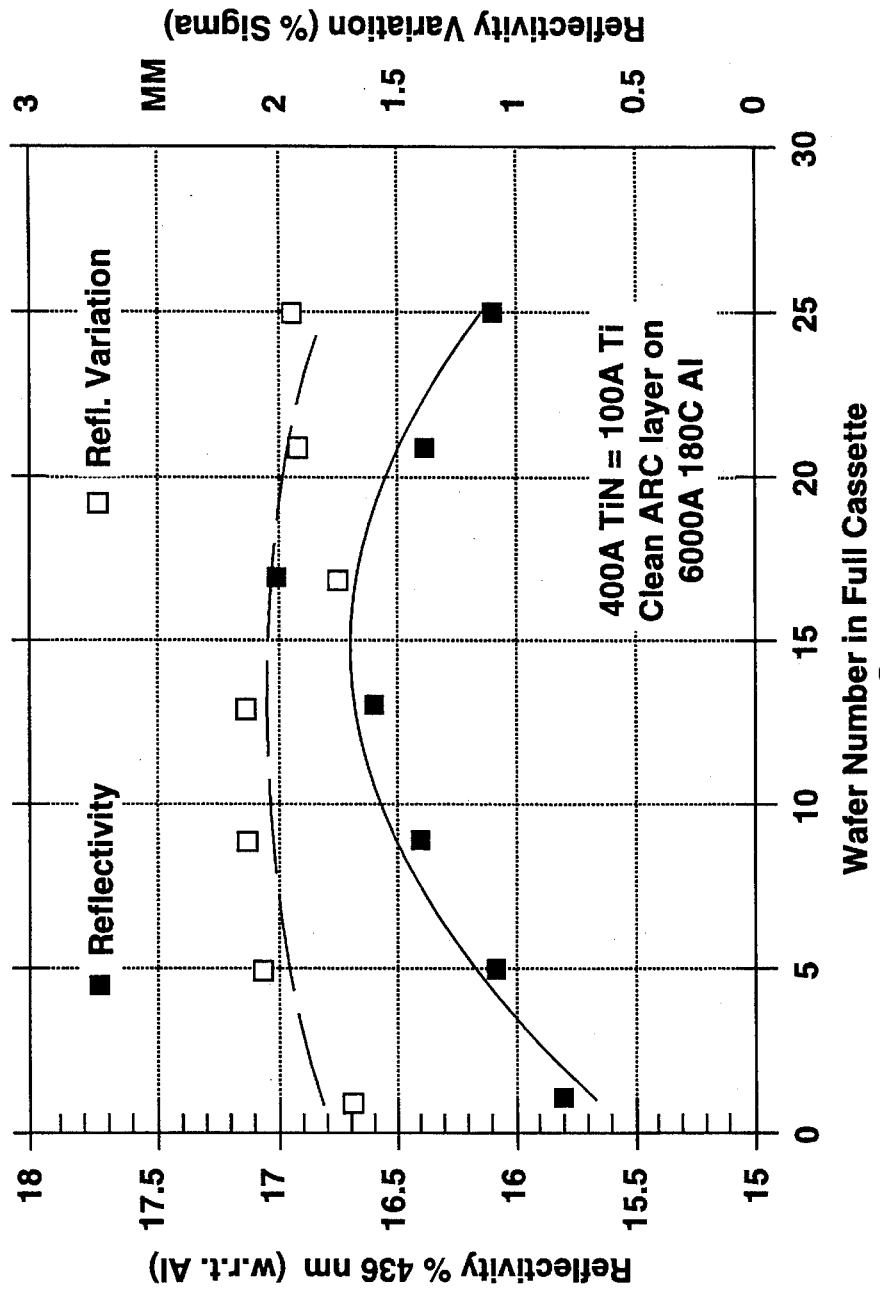
FIG. 7 is a graph showing the repeatability of the reflectivity data on 25 wafers.

FIG. 7 is a graph showing the data consistency among 25 wafers in a full cassette. The reflectivity data remains in a satisfactory range between 15%–17%. The wafers tested were coated with a 40 nm TiN layer and a 10 nm Ti cleaning layer on top of a 600 nm Al layer. These data shows that the present novel cleaning process can be reliably used in achieving consistency in all wafers without significant wafer-to-wafer variation.

The present novel method of in-situ cleaning a Ti target in a TiNARC process has been demonstrated as an effective and advantageous method for producing high quality silicon wafers. It can be used as a cleaning method for Ti target in applications where Ti and TiN are deposited in the same process chamber. Even though only applications in the Ti and TiN depositions are illustrated, applications of the present cleaning method in the deposition of a film of any other metal, i.e. W, Al or the like, and a film of the insulating compound of such metal are also possible.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiments of the invention in which an exclusive property or privilege is claimed are defined as follows.

What is claimed is:

1. A multilayer conductive structure formed on a semiconductor substrate comprising:

a) one or more conductive layers in electrical contact with said semiconductor substrate, the uppermost of said one or more layers comprising a layer of aluminum;

b) an anti-reflective coating of titanium nitride over said aluminum layer formed by sputtering titanium from a titanium target in the presence of nitrogen gas; and c) a titanium layer containing titanium nitride formed over said titanium nitride layer by sputtering titanium from said titanium target, wherein said titanium layer is sufficiently thin to retain the anti-reflective properties of said underlying anti-reflective layer of titanium nitride such that the reflectivity of the underlying titanium nitride layer surface is kept below 40%, yet thick enough to accomplish removal of titanium nitride from said titanium target deposited thereon during said sputter formation of said titanium nitride anti-reflective layer.

2. The multilayer structure of claim 1 wherein said titanium layer has a thickness not exceeding 20 nm.

3. The multilayer structure of claim 1 wherein said one or more conductive layers in electrical contact with said semiconductor substrate further comprise one or more barrier layers capable of inhibiting migration of aluminum from said aluminum layer through said one or more barrier layers to said semiconductor layer.

4. The multilayer structure of claim 3 wherein said one or more barrier layers between said semiconductor substrate and said aluminum layer further comprises a titanium nitride layer between said semiconductor substrate and said aluminum layer.

5. The multilayer structure of claim 3 wherein said one or more barrier layers between said semiconductor substrate and said aluminum layer further comprises a sputtered layer of titanium in contact with said semiconductor substrate, and a titanium nitride layer formed over said titanium layer.

6. The multilayer structure of claim 1 wherein said one or more conductive layers in electrical contact with said semiconductor substrate comprise a stack of a first titanium layer, a first titanium nitride layer, an aluminum layer, and said anti-reflective titanium nitride layer deposited thereon prior to said deposition of said titanium layer over said anti-reflective layer of titanium nitride.

7. The multilayer structure of claim 6 wherein said layer of titanium formed over said anti-reflective layer of titanium nitride has a thickness not exceeding 20 nm.

8. The multilayer structure of claim 1 wherein said anti-reflective characteristic of said anti-reflective layer of titanium nitride, as measured on the surface of said titanium layer, is less than 40%.

9. The multilayer structure of claim 1 wherein said layer of titanium formed over said anti-reflective layer of titanium nitride contains a contaminant of titanium nitride.

10. A multilayer conductive structure on a semiconductor substrate which comprises:

a) a first layer of titanium in electrical contact with said semiconductor substrate;

b) a first barrier layer of titanium nitride over said first titanium layer;

c) a layer of aluminum over said first layer of titanium nitride;

d) an anti-reflective coating of titanium nitride over said aluminum layer by sputtering titanium from a titanium target in the presence of nitrogen gas; and e) a second titanium layer over said anti-reflective titanium nitride layer formed sputtering titanium from said titanium target whereby said second titanium layer contains titanium nitride, wherein said second titanium layer is sufficiently thin to retain the anti-reflective properties of said underlying anti-reflective layer of titanium nitride such that the reflectivity of the underlying titanium nitride layer surface is kept below 40%, yet thick enough to accomplish removal of titanium nitride from said titanium target deposited thereon during said sputter formation of said titanium nitride anti-reflective layer.

\* \* \* \* \*